(12) United States Patent
Dierksmeier et al.

(10) Patent No.: US 10,612,468 B2
(45) Date of Patent: Apr. 7, 2020

(54) GAS TURBINE ENGINE WITH THERMOELECTRIC INTERCOOLER

(71) Applicant: Rolls-Royce North American Technologies, Inc., Indianapolis, IN (US)

(72) Inventors: Douglas D. Dierksmeier, Franklin, IN (US); Daniel K. Vetters, Indianapolis, IN (US); Michael A. Karam, Plainfield, IN (US)

(73) Assignee: Rolls-Royce North American Technologies Inc., Indianapolis, IN (US)

( * ) Notice: Subject to any disclaimer, the term of this patent is extended or adjusted under 35 U.S.C. 154(b) by 361 days.

(21) Appl. No.: 15/424,164

(22) Filed: Feb. 3, 2017

(65) Prior Publication Data
US 2019/0003393 A1    Jan. 3, 2019

Related U.S. Application Data

(60) Provisional application No. 62/296,846, filed on Feb. 18, 2016.

(51) Int. Cl.
| F02C 7/143 | (2006.01) |
| F25B 21/02 | (2006.01) |
| H01L 35/28 | (2006.01) |
| F01D 25/12 | (2006.01) |

(52) U.S. Cl.
CPC .............. *F02C 7/143* (2013.01); *F01D 25/12* (2013.01); *F25B 21/02* (2013.01); *H01L 35/28* (2013.01); *F05D 2260/211* (2013.01); *F05D 2260/213* (2013.01); *F25B 2321/0212* (2013.01); *Y02T 50/671* (2013.01); *Y02T 50/675* (2013.01)

(58) Field of Classification Search
CPC ................................. F02C 7/143; H01L 35/00
USPC .......................................................... 60/728
See application file for complete search history.

(56) References Cited

U.S. PATENT DOCUMENTS

| 2,990,775 | A | 7/1961 | Henson | |
| 5,547,019 | A * | 8/1996 | Iacullo | B60H 1/00478 |
| | | | | 123/563 |
| 5,584,183 | A * | 12/1996 | Wright | F25B 21/02 |
| | | | | 165/58 |
| 5,724,806 | A | 3/1998 | Horner | |
| 6,481,211 | B1 | 11/2002 | Haas | |
| 6,805,108 | B2 * | 10/2004 | Shaffer | F02B 29/0462 |
| | | | | 123/563 |

(Continued)

FOREIGN PATENT DOCUMENTS

| EP | 0391609 A1 | 10/1990 |
| EP | 0698730 A2 | 2/1996 |

(Continued)

OTHER PUBLICATIONS

Extended European Search Report, European Application No. 17156612.8-1507, dated Jul. 6, 2017, 6 pages.

(Continued)

*Primary Examiner* — Arun Goyal
*Assistant Examiner* — Henry Ng
(74) *Attorney, Agent, or Firm* — Barnes & Thornburg LLP

(57) ABSTRACT

A gas turbine engine includes a compressor, a cooling source, and a thermoelectric intercooler adapted for selective operation in response to operational states of the gas turbine engine.

19 Claims, 4 Drawing Sheets

(56) References Cited

U.S. PATENT DOCUMENTS

| | | | |
|---|---|---|---|
| 7,013,636 B2 * | 3/2006 | Iya | F02K 1/822 60/204 |
| 7,275,927 B2 * | 10/2007 | Howsam | A23P 30/20 425/326.1 |
| 7,478,525 B2 | 1/2009 | Iya et al. | |
| 2003/0234008 A1 | 12/2003 | Van Winkle | |
| 2004/0045594 A1 * | 3/2004 | Hightower | F02C 6/18 136/205 |
| 2009/0084112 A1 | 4/2009 | Ham | |
| 2009/0151321 A1 | 6/2009 | Jarmon et al. | |
| 2010/0011781 A1 * | 1/2010 | Lents | B64D 13/00 62/3.7 |
| 2010/0236595 A1 * | 9/2010 | Bell | F01P 9/06 136/205 |
| 2012/0118345 A1 | 5/2012 | Stoia et al. | |
| 2012/0240588 A1 * | 9/2012 | Patel | F02C 3/16 60/772 |
| 2013/0213054 A1 | 8/2013 | Rao et al. | |
| 2015/0214458 A1 | 7/2015 | Chakravarthy al. | |
| 2015/0372214 A1 * | 12/2015 | Kim | F02C 6/18 136/205 |
| 2016/0111623 A1 * | 4/2016 | Lee | H01L 35/30 136/208 |
| 2016/0305324 A1 * | 10/2016 | Magowan | F02K 3/077 |
| 2017/0058777 A1 * | 3/2017 | Army | F16K 49/00 |

FOREIGN PATENT DOCUMENTS

| | | |
|---|---|---|
| EP | 1746257 A2 | 1/2007 |
| JP | 2008 232086 A | 10/2008 |

OTHER PUBLICATIONS

Japanese Patent Publication No. 2008232086 with English abstract.

* cited by examiner

|  | Ground Idle | Takeoff | Climb | Cruise | Flight Idle |
|---|---|---|---|---|---|
| Air/Air Intercooler | | | | | |
| No Power | X | | | | X |
| Power Out | | | | | |
| Power In (Mode A) | | X | X | X | |
| Power In (Mode B) | | | | | |
| | | | | | |
| Fuel/Air Intercooler | | | | | |
| No Power | | | | X | |
| Power Out | | | | | |
| Power In (Mode A) | | X | X | | |
| Power In (Mode B) | X | | | | X |

*FIG. 4*

GAS TURBINE ENGINE WITH THERMOELECTRIC INTERCOOLER

CROSS REFERENCE TO RELATED APPLICATIONS

This application claims priority to and the benefit of U.S. Provisional Patent Application No. 62/296,846, filed 18 Feb. 2016, the disclosure of which is now expressly incorporated herein by reference.

FIELD OF THE DISCLOSURE

The present disclosure relates generally to gas turbine engines, and more specifically to the interaction of sub-systems used in gas turbine engines.

BACKGROUND

Gas turbine engines are used to power compressor aircraft, watercraft, power generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Exhaust products of the combustion reaction in the combustor are directed into the turbine where work is extracted to drive the compressor and, sometimes, an output shaft, fan, or propeller.

Some gas turbine compressors arrangements may have multiple stages of compression. Gas turbine engines multi-stage compression may include intercooler heat exchangers (intercoolers), disposed to cool the partially compressed gas between the multiple stages of compression.

SUMMARY

The present disclosure may comprise one or more of the following features and combinations thereof.

According to an aspect of the present disclosure, a gas turbine engine for generating drive from combustion of fuel may include a compressor including a plurality of rotating stages each adapted to compress air, a cooling source adapted to provide coolant to the compressor of the gas turbine engine, and a thermoelectric intercooler located axially between rotating stages of the compressor along a central engine axis, the thermoelectric intercooler including a compressed air passageway fluidly coupled to the compressor to pass compressed air of the compressor therethrough, a coolant passageway fluidly coupled to the cooling source to pass coolant of the cooling source therethrough, and a thermoelectric section configured in thermal communication with each of the compressed air passageway and the coolant passageway. The thermoelectric section may be disposed between the compressed air passageway and the coolant passageway.

In some embodiments, the gas turbine engine may include a controller configured to determine an operational state of the gas turbine engine and to selectively apply voltage across the thermoelectric section based on the operational state of the gas turbine engine.

In some embodiments, the cooling source may be one of a fuel system of the gas turbine engine and a cooling air stream.

In some embodiments, the gas turbine engine may be configured to provide propulsion for an aircraft and the operational state of the gas turbine engine includes one of ground idle, takeoff, climb, cruise, and flight idle.

In some embodiments, the controller may be configured to apply voltage across the thermoelectric section to direct current through the thermoelectric section in a first direction in response to determination that the operational state of the gas turbine engine is one of takeoff and climb to encourage heat transfer through the thermoelectric section from the compressed air passageway to the coolant passageway.

In some embodiments, the controller may be configured to apply voltage across the thermoelectric section to direct current through the thermoelectric section in a second direction in response to determination that the operational state of the gas turbine engine is one of ground idle and flight idle.

In some embodiments, the controller may be configured to exchange no electric power with the thermoelectric section in response to determination that the operational state of the gas turbine engine is one of ground idle, cruise, and flight idle.

In some embodiments, the thermoelectric section may include a number of electrically connected thermoelectric layers and the compressed air passageway includes a number of compressed air conduits each having at least one wall in thermal communication with at least one of the thermoelectric layers.

In some embodiments, the at least one of the number of compressed air conduits may have a circumferential width that is tapered along a radial direction.

In some embodiments, the coolant passageway may include a number of coolant conduits each having at least one wall in thermal communication with at least one of the thermoelectric layers and each of the coolant conduits defines a coolant flow path that extends radially in communication with a turnaround passage of the coolant passageway.

According to another aspect of the present disclosure, a gas turbine engine for generating drive from combustion of fuel may include a compressor system, a coolant system, and a thermoelectric intercooler including a compressed air passageway fluidly coupled to the compressor system to conduct air from the compressor system therethrough, a coolant passageway fluidly coupled to the coolant system to pass coolant of the coolant system therethrough, and a thermoelectric section configured in thermal communication with each of the compressed air passageway and the coolant passageway.

In some embodiments, the gas turbine engine may include a controller configured to determine an operational state of the gas turbine engine and to selectively apply voltage across the thermoelectric section based on the operational state of the gas turbine engine.

In some embodiments, the gas turbine engine may be configured to provide propulsion for an aircraft and the operational state of the gas turbine engine includes one of ground idle, takeoff, climb, cruise, and flight idle.

In some embodiments, the controller may be configured to apply voltage across the thermoelectric section to direct current through the thermoelectric section in a first direction in response to determination that the operational state of the gas turbine engine is one of takeoff, climb, and cruise to allow heat transfer through the thermoelectric section from the compressed air passageway to the coolant passageway.

In some embodiments, the controller may be configured to apply voltage across the thermoelectric section to direct current through the thermoelectric section in a second direction in response to determination that the operational state of the gas turbine engine is one of ground idle and flight idle.

In some embodiments, the controller may be configured to provide no electric power to the thermoelectric section in response to determination that the operational state of the gas turbine engine is one of ground idle, cruise, and flight idle.

According to another aspect of the present disclosure, a method of operating a gas turbine engine for providing propulsion for an aircraft may include determining an operational state of the aircraft, determining a desired electric power to provide to a thermoelectric section of a thermoelectric intercooler of the gas turbine engine based at least in part on the operational state of the aircraft, and applying the desired electric power to the thermoelectric section of the thermoelectric intercooler.

In some embodiments, applying the desired electric power may include directing current through the thermoelectric section in a first direction to encourage heat removal from a compressor of the engine.

In some embodiments, applying the desired electric power may include directing current through the thermoelectric section in a second direction to encourage heat transfer into a compressor of the engine.

In some embodiments, determining the desired electric power may include receiving information regarding operational parameters of the engine and determining the desired electric power based on the received information.

These and other features of the present disclosure will become more apparent from the following description of the illustrative embodiments.

BRIEF DESCRIPTION OF THE DRAWINGS

FIG. 4 is a table of exemplary operational states of the gas turbine engine of FIG. 1 adapted for use in aircraft propulsion and their general correspondence to a No Power condition in which no electric power is provided to the thermoelectric intercooler, a Power IN (Mode A) condition in which electric power is provided to the thermoelectric intercooler to cause heat transfer from the compressed air passageway to the coolant passageway, a Power IN (Mode B) condition in which electric power is provided to the thermoelectric intercooler to cause heat transfer from the coolant passageway to the compressed air passageway;

DETAILED DESCRIPTION OF THE DRAWINGS

Figure 1:
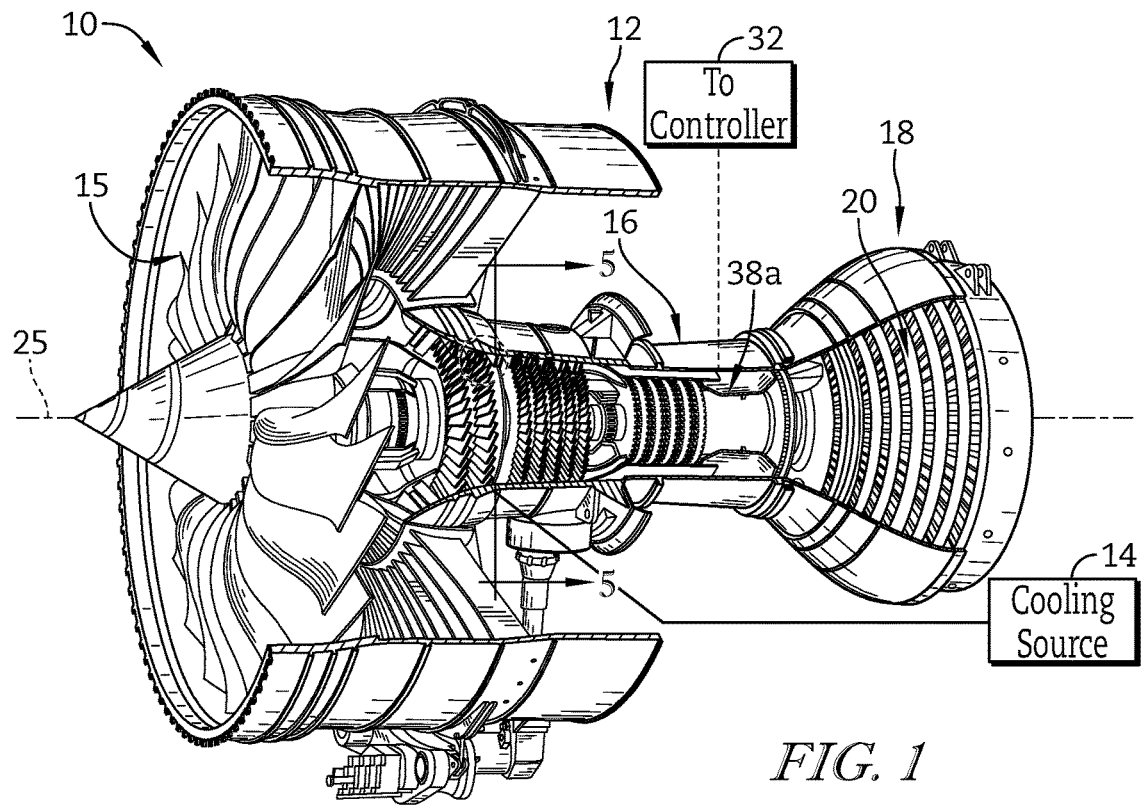
FIG. 1 is a partially diagrammatic gas turbine engine for generating thrust from the combustion of fuel diagrammatically showing that the gas turbine engine includes a compressor, a cooling source, and a thermoelectric intercooler for controlling heat exchange between the compressor and the cooling source, and showing that the thermoelectric intercooler is disposed between stages of the compressor.

For the purposes of promoting an understanding of the principles of the disclosure, reference will now be made to a number of illustrative embodiments illustrated in the drawings and specific language will be used to describe the same.

Figure 2:
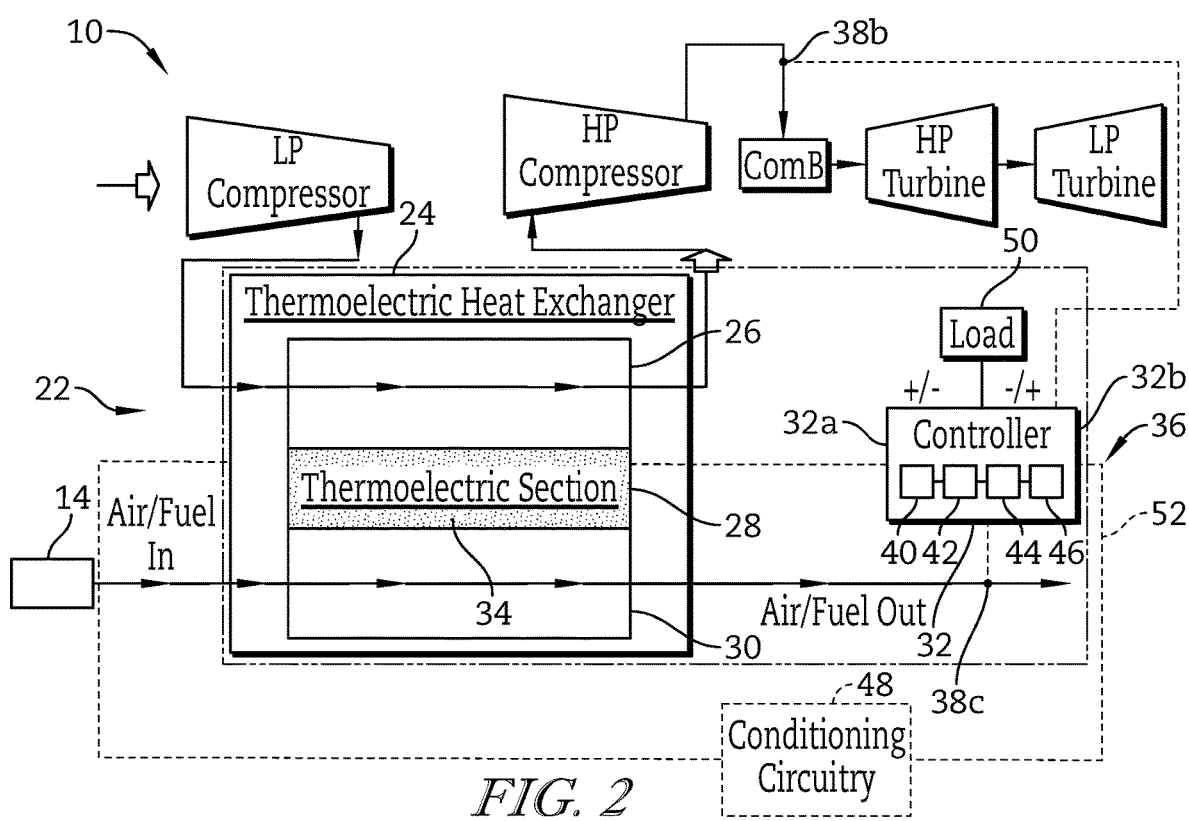
FIG. 2 is a diagrammatic gas thermoelectric intercooler of the gas turbine engine of FIG. 1 showing that the thermoelectric intercooler includes a compressed air passageway, a coolant passageway, and a thermoelectric layer, and showing that a controller of the gas turbine engine has circuitry for determining an operational state of the gas turbine engine and for selectively operating to supply electric power to the thermoelectric section of the thermoelectric intercooler based on the determined operational state.

An illustrative gas turbine engine 10 with a portion cut away to illustrate that the engine 10 includes a compressor 12, a combustor 16, and a turbine 18 as shown in FIGS. 1 and 2. The compressor 12 compresses and delivers air to the combustor 16. The combustor 16 mixes fuel with the compressed air from the compressor 12 and combusts the mixture. The hot, high-pressure exhaust products of the combustion reaction in the combustor 16 are directed into the turbine 18 to cause the turbine blade 20 to rotate about an axis 25 to drive a fan 15 and compressor 12.

Compressor 12 illustratively includes a number of compressor stages including a low pressure (LP) stage 12a and a high pressure (HP) stage 12b as shown in FIG. 2. In some embodiments, compressor 12 may include any number of compressor stages suitable to provide compressed air for combustion. In the illustrative embodiment, gas turbine engine 10 includes the compressor 12, a cooling source 14, and a thermoelectric system 22 for governing heat transfer between compressor 12 and cooling source 14.

Thermoelectric system 22 illustratively includes a thermoelectric intercooler 24 for conducting heat between compressor 12 and cooling source 14, and a controller 32 for governing operation of thermoelectric intercooler 24. Thermoelectric intercooler 24 is illustratively disposed in fluid communication with compressor 12. In the illustrative embodiment, thermoelectric intercooler 24 is positioned within the flow path of the compressed air between compressor stages 12a, 12b. Among other operations discussed herein, thermoelectric system 22 is configured to provide interstage cooling of the compressed air to transfer heat of compression from the compressed air to a cooling source 14 to improve thermodynamic efficiency of the engine 10.

Thermoelectric system 22 is illustratively configured to cool the compressed air of the compressor 12 using coolant from the cooling source 14 as a heat sink. In the illustrative embodiment, the thermoelectric system 22 can be operated to remove additional heat (i.e., to provide additional cooling) from the compressed air and to drive heat transfer to the coolant. The additional heat removed from the compressed air enables a reduction in the overall size of the intercooler 24 when compared with traditional intercoolers.

However, the heat transfer desired between the compressor 12 and the cooling source 14 can vary according to operational conditions and scenarios of the engine 10. The specific operational scenarios of gas turbine engines themselves can vary according to the adapted use of the engine 10.

In the illustrative embodiment, gas turbine engine 10 is adapted for use in an aircraft and heat exchange between compressor 12 and the cooling source 14 is described in the context of aircraft operational states including ground idle, takeoff, climb, cruise, and flight idle. In some embodiments, gas turbine engine 10 may be adapted for any known use including stationary and/or mobile electric power generation, direct and/or indirect propulsion of any manner of vehicle and/or device, and/or combinations thereof, and operational states may vary accordingly. Thermoelectric system 22 is illustratively controllable to regulate (i.e., selectively encourage or discourage) heat transfer through thermoelectric intercooler 24 (and therefore between compressor 12 and cooling source 14) according to various operating conditions of gas turbine engine 10.

As shown in FIG. 2, thermoelectric intercooler 24 illustratively includes a compressed air passageway 26, a coolant passageway 30, and a thermoelectric section 28 in thermal communication with each of the compressed air and coolant passageways 26, 30. Compressed air passageway 26 is illustratively fluidly connected to LP compressor stage 12*a* to receive compressed air therefrom, and is fluidly connected to HP compressor stage 12*b* to deliver compressed air received from LP stage 12*a*. Coolant passageway 30 illustratively fluidly connected to the cooling source 14 to receive and return coolant, but in some embodiments may be fluidly connect to provide coolant to other engine subsystems. In the illustrative embodiment, thermoelectric section 28 is disposed between the compressed air passageway 26 and the coolant passageway 30 as a thermal conduit through which heat can be communicated between the compressor 12 and the cooling source 14.

Figure 3:
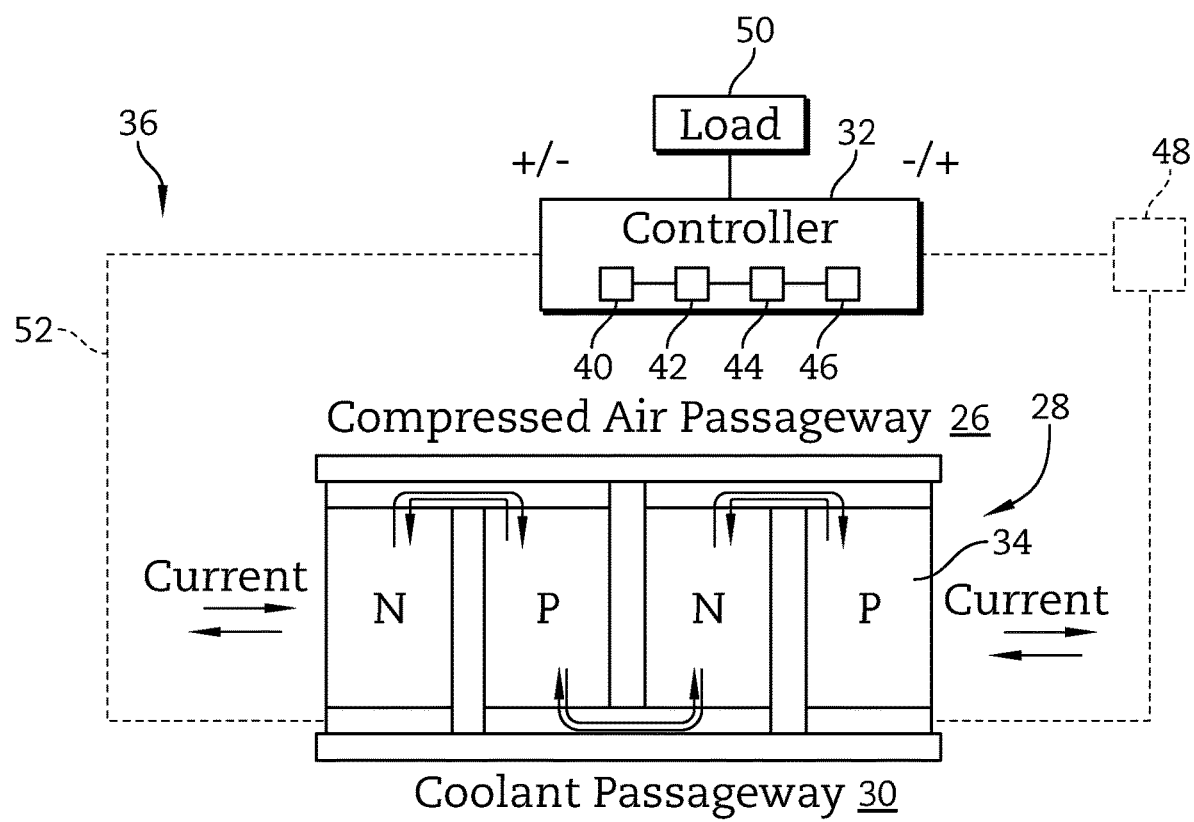
FIG. 3 is a diagrammatic view of an illustrative embodiment of the thermoelectric intercooler of the gas turbine engine of FIGS. 1 and 2 showing that thermoelectric section includes a circuit of semiconductor materials including positively charged (P-type) and negatively charged (N-type) thermoelectric materials arranged in alternating series to provide a thermoelectric circuit for receiving current therethrough in a first direction (counter-clockwise) encouraging transfer of heat through the thermoelectric section from the compressed air passageway to the coolant passageway, and in a second direction (clockwise) discouraging transfer of heat through the thermoelectric section from the compressed air passageway to the coolant passageway.

As shown in FIGS. 2 and 3, thermoelectric section 28 of thermoelectric intercooler 24 illustratively includes a thermoelectric material 34 having thermoelectric properties. In the illustrative embodiment, thermoelectric material 34 is configured such that the heat flow (rate) through the thermoelectric material 34 is regulated by selectively applying a voltage differential across the thermoelectric material 34 to drive current through thermoelectric material 34. Devices operating under similar principles are sometimes referred to Peltier and/or Seebeck devices.

Thermoelectric material 34 is illustratively embodied of N-type and P-type semiconductor materials arranged in alternating sequence and electrically connected to controller 32 by wiring 52 form a thermoelectric circuit 36. In the illustrative embodiment, driving no current through thermoelectric circuit 36 permits only natural heat transfer through thermoelectric intercooler 24. Illustratively, driving electric current through thermoelectric circuit 36 in a first direction (counter-clockwise, as shown in FIGS. 2 and 3) encourages heat transfer in the direction from the compressed air passageway 26 to the coolant passageway 30. Illustratively, driving electric current through thermoelectric circuit 36 in a second direction (clockwise, as shown in FIGS. 2 and 3) discourages heat transfer in the direction from the compressed air passageway 26 to the coolant passageway 30. Controller 32 illustratively regulates operation of thermoelectric intercooler 24 through thermoelectric circuit 36.

As discussed below, in some embodiments, the amount of current driven in the second direction may be configured such that heat transfer is encouraged from the coolant passageway 30 to the compressed air passageway 26. In the foregoing description, the directions of electric current flow are used for non-limiting illustration purposes. In some embodiments, the absolute direction of current flow may differ from the description based on the particular geometric configuration of the thermoelectric section 28.

In the illustrative embodiment, controller 32 selectively operates thermoelectric section 28 through thermoelectric circuit 36 to enable controlled heat transfer between compressor 12 and cooling source 14 as suggested in FIG. 3. Illustratively, controller 32 selectively applies voltage to direct current in a particular direction through thermoelectric section 28 to encourage or discourage heat transfer between the compressed air passageway 26 and the coolant passageway 30. Controller 32 determines a desired control of thermoelectric inercooler 24 based on a various turbine engine operational conditions.

Controller 32 regulates the rate of heat flow between compressor 12 and cooling source 14 by controlling the amount and direction of electric current directed through thermoelectric circuit 36. Controller 32 regulates the direction of electric current directed through thermoelectric material 34 by selective application of the polarity of the voltage applied to thermoelectric circuit 36. Controller 32 selectively applies voltage to thermoelectric material 34 with particular polarity by inducing either a positive or negative pole at one terminal 32*a*, 32*b*, and the other of a positive or negative pole at the other terminal 32*a*, 32*b*. By selectively applying electric power with a voltage of a particular polarity (and thus driving electric current in a particular direction), controller 32 regulates the direction of influence of thermoelectric section 28 on the heat transfer between the compressed air passageway 26 and the coolant passageway 30.

When controller 32 determines that the desired control requires augmented heat transfer between compressor 12 and cooling source 14, controller 32 illustratively applies a voltage across thermoelectric section 28 through wiring 52 with polarity according to the desired heat transfer. In the illustrative embodiment as shown in FIG. 3, when the controller 32 determines that additional heat transfer is desired from compressor 12 to the cooling source 14, controller 32 directs electric current through thermoelectric circuit 36 in the first direction (counter-clockwise) that causes thermoelectric material 34 to encourage heat transfer from compressed air passageway 26 to coolant passageway 30. When the controller 32 determines that less than natural heat transfer is desired from the compressor 12 to the cooling source 14, controller 32 directs electric current through thermoelectric circuit 36 in the second direction (clockwise) that causes thermoelectric material 34 to discourage heat transfer from compressed air passageway 26 to coolant passageway 30.

In the illustrative embodiment, the amount of electric current directed through thermoelectric section 28 has a proportional relationship to the magnitude of the influence that thermoelectric material 34 exerts on heat flow between passageways 26, 30. A greater amount of current directed through thermoelectric section 28 in a given direction (first or second) yields a greater influence (encouragement or discouragement) on the heat flow between passageways 26, 30. A lesser amount of current directed through thermoelectric section 28 in a given direction (first or second) yields a lesser influence on heat flow between passageways 26, 30. However, it should be appreciated that this proportional relationship is not necessarily linear or the same in both directions of electric current. As mentioned above and discussed in detail below, it is within the present disclosure that a determined amount of current directed through thermoelectric section 28 in the second direction causes thermoelectric section to drive heat transfer from coolant passageway 30 into compressed air passageway 26.

In the illustrative embodiment, the controller 32 determines the amount of electric current to be directed through the thermoelectric circuit 36 based on the operating parameters of the engine 10. Thermoelectric system 22 includes sensors 38, discussed in detail below, adapted to detect operating parameters of the engine 10 and to send signals indicative of the detected operating parameters to controller 32. The controller 32 determines the desired heat transfer between compressor 12 and cooling source 14 based on the operating parameters.

Referring to FIG. 4, a first illustrative embodiment of the thermoelectric intercooler 24 of turbine engine 10 adapted for use in propulsion of an aircraft is described relative to a table of exemplary operational scenarios. In the first illustratively embodiment of thermoelectric intercooler 24 the cooling source 14 is illustratively embodied as a cooling air stream, such that thermoelectric intercooler 24 is an air-cooled intercooler. Exemplary operational conditions of the air-cooled intercooler 24 are described in the context of aircraft operational states including ground idle, takeoff, climb, cruise, and flight idle.

During flight idle and ground idle operational states of the aircraft, the controller 32 illustratively determines that natural heat transfer between the compressor 12 and the cooling source 14 (air stream) is acceptable. The controller 32 is illustratively configured in a No Power condition to provide no electric current (No Power) to thermoelectric section 28 such that only natural heat transfer through thermoelectric intercooler 24 is permitted.

During takeoff, climb, and cruise operational states of the aircraft, the controller 32 determines that additional heat transfer from compressor 12 to cooling source 14 is desired. The controller 32 is illustratively configured in a Power In (Mode A) condition to provide electric current through thermoelectric circuit 36 in the first direction (counter-clockwise according to FIGS. 2 and 3) to encourage heat transfer from compressed air passageway 26 to coolant passageway 30.

Without reference to a particular operational scenario, it should be understood that according to operating parameters of engine 10, controller 32 may determine that less than natural heat transfer from compressor 12 to cooling source 14 is desired, and may determine and execute to provide electric current through thermoelectric circuit 36 in the second direction with an amount determined to discourage (decrease) heat flow from compressor 12 to cooling source 14 accordingly, which may include imposing a net heat transfer of zero.

Returning to FIGS. 2 and 3, controller 32 illustratively includes a processor 40, a memory device 42, and a transceiver 44 as shown in FIGS. 1 and 2. Transceiver 44 illustratively communicates signals with various gas turbine engine systems and relays the information to processor 40. Processor 40 illustratively executes instructions stored on memory device 42, based on the information from transceiver 44, to determine the desired operation of thermoelectric intercooler 24. In some embodiments, thermoelectric system 22 may include conditioning circuitry 48 configured to condition the flow of electric power within wiring 52.

In the illustrative embodiment as shown in FIG. 2, controller 32 includes electrical circuitry 46 configured for connection of thermoelectric circuit 36 (and thus thermoelectric section 28) to load 50 in selective arrangement according to the voltage and current requirements determined by controller 32. Electrical circuitry 46 illustratively includes various electrical hardware components configured to selectively provide the determined amount and configuration of electrical power to thermoelectric intercooler 24. In some embodiments, the hardware of electrical circuitry 46 may include any number and combination of active and/or passive components, for example, transistor diodes, arranged for selectively electrical connection of thermoelectric section 28 to load 50.

Electrical circuitry 46 is illustratively shown within the box of controller 32, but in some embodiments electrical circuitry may be wholly or partly district from, but governed by controller 32. In the illustrative embodiment, all electric power provided to thermoelectric section 28 is illustratively provided by the same load 50 by configuration of electrical circuitry 46, but in some embodiments electric power may be provided to thermoelectric section 28 via different loads. In some embodiments, fuel flow rate sensors may communicate with controller 32 to for consideration of the consumption rate of fuel in the operational state determination.

As previously mentioned regarding FIG. 1, controller 32 regulates heat transfer through thermoelectric intercooler 24 according to various operating conditions of gas turbine engine 10. Controller 32 determines the operational state of turbine engine 10 based on information received from various sources. In the illustrative embodiment, controller 32 is connected to sensors 38a, 38b, 38c to receive information therefrom. Sensors 38a, 38c, are respectively configured to detect and communicate to controller 32 the temperature of compressor 12 and cooling source 14. Sensors 38a, 38c are illustratively shown as positioned respectively in the compressor outlet stream and the coolant outlet of the coolant passageway 30, but in some embodiments may be in any suitable location. Sensor 38b is configured to detect and communicate to controller 32 the rotational speed of turbine engine 10.

Controller 32 is configured to determine the operational state of turbine engine 10 based on the received information. In the illustrative embodiment, controller 32 determines the operational state based at least on the rotational speed of turbine engine 10. In some embodiments, controller 32 may determine operational state based on any of turbine engine rotational speed, acceleration (such as engine rotation and/or vehicle movement), position (such as altitude), adapted system control conditions (such as flight controls position), fuel flow rate, and/or combinations thereof, and may do so based on one or more of past, present, and/or predicted conditions thereof. In some embodiments, operating conditions and operational states may be determined by any direct and/or indirect manner suitable for such control.

Figure 5:
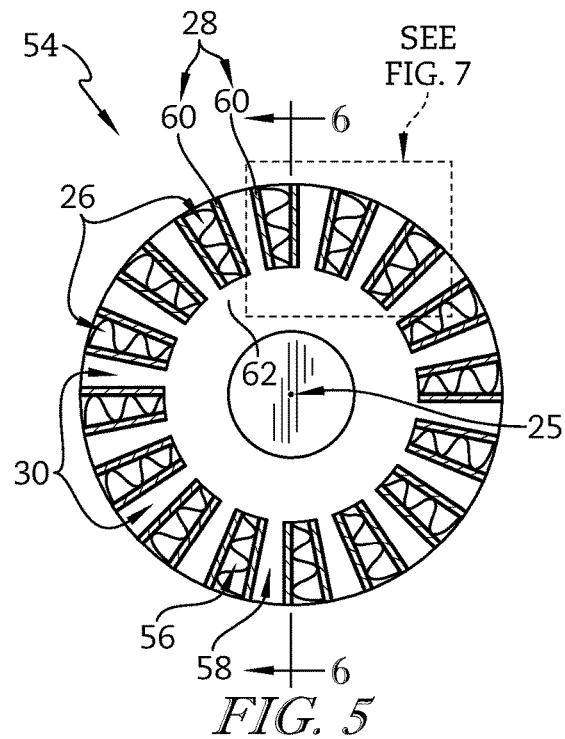
FIG. 5 is a front view of an embodiment of the thermoelectric intercooler of FIGS. 1-3 looking along the line 5-5 in FIG. 1, showing that the thermoelectric section of the thermoelectric intercooler includes a plurality of thermoelectric layers and that each of the compressed air passageway and the coolant passageway includes a number of conduits having at least one wall in thermal communication with one of the thermoelectric layers, and showing that the coolant passageway includes a turn-around passage.

Referring now to FIG. 5, an illustrative embodiment of the thermoelectric intercooler 24 is shown along axis 25. Thermoelectric intercooler 24 illustratively includes an annular body 54 including the compressed air passageway 26 comprising a number of compressed air conduits 56, and the coolant passageway 30 comprising a number of coolant conduits 58, and a turnaround passage 62 illustratively arranged radially inward of the conduits 56, 58 and fluidly connected to coolant conduits 58. The conduits 56, 58 are illustratively arranged circumferentially around the body 54 in alternating sequence along the circumferential direction. Thermoelectric intercooler 24 includes a number of thermoelectric layers 60 disposed between and in thermal communication with each adjacent conduit 56, 58.

Figure 6:
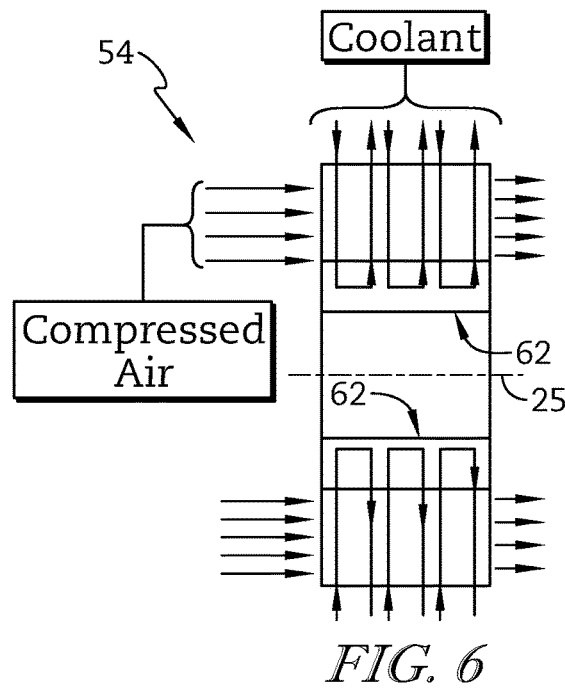
FIG. 6 is diagrammatic cross-sectional view of the thermoelectric intercooler of FIG. 5 taken along the line 6-6 from FIG. 5, showing that the coolant passageway includes a turn-around passage and is arranged to define a coolant flow path that extends radially in connection with the turn-around passage.

As shown in FIG. 6, thermoelectric intercooler 24 is illustratively arranged as a cross-flow heat exchanger. Compressed air from compressor 12 is illustratively directed axially through the compressed air conduits 56. Coolant from cooling source 14 is illustratively directed radially through coolant conduits 58. In the illustratively embodiment, a number of coolant conduits 58 are positioned along the axial direction in communication with the turnaround passage 62 as represented by the coolant streams in FIG. 6.

Figure 7:
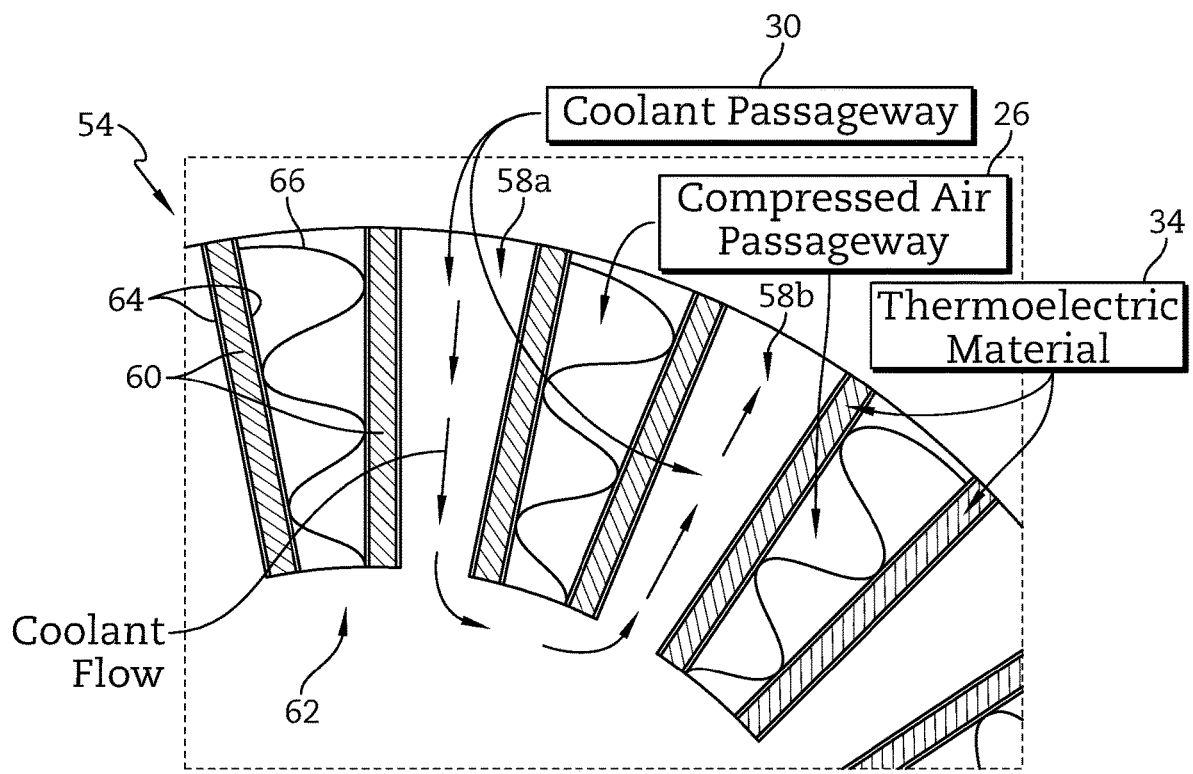
FIG. 7 is a closer view of a portion of the thermoelectric intercooler of FIG. 5 showing that the conduits of the compressed air passageway are wedge shaped and have a circumferential width that is that is tapered along the radial direction, and showing that the compressed air conduits and the coolant conduits are positioned to alternate in the circumferential direction with a thermoelectric layer disposed between adjacent conduits.

FIG. 7 shows a closer view of a portion of thermoelectric intercooler 24 of FIG. 5. Each of the conduits 56, 58 illustratively includes a pair of sidewalls 64 extending radially from the turnaround passage 62. Each sidewall 64 is in thermal communication with one of the thermoelectric layers 60 and one of the conduits 56, 58. Each of the compressed air conduits 56 illustratively include a corrugated wall 66 curving to extend along the radial direction between sidewalls 64 of each compressed air conduit 56 to provide support thereto while allowing axial flow (into the page in FIG. 7) of compressed air through conduit 56. Each of the coolant conduits 58 illustratively include a corrugated wall curving to extend along the axial direction between sidewalls 66 of each coolant conduit 58 to provide support thereto while allowing radial flow of coolant through conduit 58. In the illustrative embodiment, the conduits 56, 58 each have a wedge shape that has a circumferential width that widens with increasing radial distance from the turnaround passage 62.

In the illustrative embodiment, the turnaround passage 62 is fluidly connected to each coolant conduit 58 as shown in FIGS. 5 and 7. Coolant conduits 58 illustratively include inlet conduits 58a and outlet conduits 58b in alternating circumferential arrangement about annular body 54. Coolant illustratively flows radially inward through inlet conduit 58a into turnaround passage 62 and radially outward through outlet conduit 58b. Coolant within inlet and outlet conduits 58a, 58b is illustratively in thermal communication with thermoelectric section 28 through the respective sidewalls 64 thereof.

Returning now to FIG. 4, a second illustrative embodiment of the thermoelectric intercooler 24 of turbine engine 10 adapted for use in propulsion of an aircraft is described relative to the table of exemplary operational scenarios. The descriptions and drawings of the first embodiment of thermoelectric intercooler 24 are incorporated by reference to apply to the second embodiment, except where explicitly differentiated and/or in instances where the description and drawings of the second embodiment conflicts with that of the first embodiment. In the second illustrative embodiment of thermoelectric intercooler 24 the cooling source 14 is illustratively embodied as a fuel system of the engine 10, such that thermoelectric intercooler 24 is a fuel-cooled intercooler.

During the cruise operational state of the aircraft, the controller 32 determines that natural heat transfer between the compressor 12 and the fuel system (cooling source) 14 is acceptable. The controller 32 is illustratively configured in a No Power condition to provide no electric current to thermoelectric intercooler 24 such that only natural heat transfer through thermoelectric section 28 is permitted.

During takeoff and climb operational states of the aircraft, the controller 32 determines that an amount of heat transfer from compressor 12 to fuel system (cooling source) 14 is desired. The controller 32 is illustratively configured in a Power In (Mode A) condition to provide electric current through thermoelectric circuit 36 in the first direction (counter-clockwise according to FIGS. 2 and 3) to encourage heat transfer from compressed air passageway 26 to fuel (coolant) passageway 30.

During ground idle and flight idle operational states of the aircraft, the controller 32 determines that heat transfer from fuel system (cooling source) 14 to compressor 12 is desired. The controller 32 is illustratively configured in a Power In (Mode B) condition to provide electric current through thermoelectric circuit 36 in the second direction (clockwise according to FIGS. 2 and 3) to encourage heat transfer from to fuel (coolant) passageway 30 to compressed air passageway 26. In Mode B, the fuel can be cooled to prevent coking and other fuel system temperature related issues.

Without reference to a particular operational scenario, it should be understood that according to operating parameters of engine 10, controller 32 may determine that less than natural heat transfer from compressor 12 to fuel system (cooling source) 14 is desired, and may determine and execute to provide electric current through thermoelectric circuit 36 in the second direction with an amount determined to discourage (decrease) heat flow from compressor 12 to fuel system (cooling source) 14 accordingly, which may include imposing a net heat transfer of zero.

The descriptions of control scenarios, including the corresponding control based on operational scenarios and those described with respect to the table of FIG. 4, are exemplary in nature and are intended to pertain to general aircraft. In some embodiments, configuration of power exchange with thermoelectric section 28 into any of the No power, Power In, Power Out modes, including on the basis of the operational scenarios, may varying according to the type of aircraft being any of fighter, commercial, helicopter aircraft.

The present disclosure includes devices and methods which can potentially reduce cost and weight of systems and improve thermodynamic performance. The present disclosure includes devices and methods for allowing heat exchange between systems of similar and different temperatures, including from low temperature to high temperature.

The present disclosure includes circulation and/or transfer of fluids between and among certain portions of the overall turbine engine 10, and accordingly may include various equipment and accessories to achieve such circulation and/or transfer of fluids, including pumps, blower, piping, ducts, valves, dampers, gauges, sensors, and/or wiring, in any number and arrangement to support the other portions of the disclosure.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A gas turbine engine for generating drive from combustion of fuel, comprising
a compressor comprising a plurality of rotating stages each adapted to generate compressed air,
a cooling source adapted to provide coolant to the compressor of the gas turbine engine, and
a thermoelectric intercooler located axially between rotating stages of the plurality of rotating stages of the compressor along a central engine axis of the gas turbine engine, the thermoelectric intercooler comprising a compressed air passageway fluidly coupled to the compressor to pass the compressed air of the compressor between first and second rotating stages of the rotating stages of the compressor, a coolant passageway fluidly coupled to the cooling source to pass coolant of the cooling source therethrough, and a thermoelectric section configured in thermal communication with each of the compressed air passageway and the coolant passageway,
wherein the compressed air passageway comprises a plurality of compressed air conduits, and the coolant passageway comprises a plurality of coolant conduits each defining a coolant flow path that extends radially in communication with a turnaround passage formed between two adjacent coolant conduits of the plurality of coolant conduits;
wherein a compressed air flow path through the plurality of compressed air conduits is transverse to the coolant flow path through the plurality of coolant conduits; and
wherein the thermoelectric section is disposed between one of the plurality of compressed air conduits and one of the plurality of coolant conduits.

2. The gas turbine engine of claim 1, further comprising a controller configured to determine an operational state of the gas turbine engine and to selectively apply voltage across the thermoelectric section based on the operational state of the gas turbine engine.

3. The gas turbine engine of claim 2, wherein the cooling source is one of a fuel system of the gas turbine engine and a cooling air stream.

4. The gas turbine engine of claim 2, wherein the gas turbine engine is configured to provide propulsion for an aircraft and the operational state of the gas turbine engine includes one of ground idle, takeoff, climb, cruise, and flight idle.

5. The gas turbine engine of claim 4, wherein the controller is configured to apply voltage across the thermoelectric section to direct current through the thermoelectric section in a first direction in response to determination that the operational state of the gas turbine engine is the one of takeoff and climb to encourage heat transfer through the thermoelectric section from the compressed air passageway to the coolant passageway.

6. The gas turbine engine of claim 4, wherein the controller is configured to apply voltage across the thermoelectric section to direct current through the thermoelectric section in a second direction in response to determination that the operational state of the gas turbine engine is the one of ground idle and flight idle.

7. The gas turbine engine of claim 4, wherein the controller is configured to exchange no electric power with the thermoelectric section in response to determination that the operational state of the gas turbine engine is the one of ground idle, cruise, and flight idle.

8. The gas turbine engine of claim 1, wherein the thermoelectric section comprises a plurality of electrically connected thermoelectric layers, and wherein the plurality of compressed air conduits each have at least one wall in thermal communication with at least one of the plurality of electrically connected thermoelectric layers.

9. The gas turbine engine of claim 8, wherein at least one of the plurality of compressed air conduits has a circumferential width that is tapered along a radial direction.

10. A gas turbine engine for generating drive from combustion of fuel, comprising:
a compressor system, a combustion system, and a turbine,
a coolant system,
a thermoelectric intercooler including:
a compressed air passageway fluidly coupled to the compressor system to conduct air from the compressor system to another stage of the gas turbine engine, the compressed air passageway comprising a plurality of compressed air conduits,
a coolant passageway comprising a plurality of inlet and outlet conduits fluidly coupled to the coolant system to pass coolant of the coolant system therethrough wherein the inlet and outlet conduits are configured in alternating circumferential arrangement about an annular body of the compressor system,
wherein each of the plurality of inlet and outlet conduits extends radially in communication with a turnaround passage formed between two adjacent conduits of the plurality of inlet and outlet conduits,
wherein a compressed air flow path through the plurality of compressed air conduits is transverse to a coolant flow path through the plurality of inlet and outlet conduits, and
a thermoelectric section configured in thermal communication with one of the plurality of compressed air conduits and one of the plurality of inlet and outlet conduits.

11. The gas turbine engine of claim 10, further comprising a controller configured to determine an operational state of the gas turbine engine and to selectively apply voltage across the thermoelectric section based on the operational state of the gas turbine engine.

12. The gas turbine engine of claim 11, wherein the gas turbine engine is configured to provide propulsion for an aircraft and the operational state of the gas turbine engine includes one of ground idle, takeoff, climb, cruise, and flight idle.

13. The gas turbine engine of claim 12, wherein the controller is configured to apply voltage across the thermoelectric section to direct current through the thermoelectric section in a first direction in response to determination that the operational state of the gas turbine engine is the one of takeoff, climb, and cruise to allow heat transfer through the thermoelectric section from the compressed air passageway to the coolant passageway.

14. The gas turbine engine of claim 12, wherein the controller is configured to apply voltage across the thermoelectric section to direct current through the thermoelectric section in a second direction in response to determination that the operational state of the gas turbine engine is the one of ground idle and flight idle.

15. The gas turbine engine of claim 12, wherein the controller is configured to provide no electric power to the thermoelectric section in response to determination that the operational state of the gas turbine engine is the one of ground idle, cruise, and flight idle.

16. A method of operating a gas turbine engine for providing propulsion for an aircraft, the method comprising:
- determining an operational state of the aircraft propelled by the gas turbine engine comprising a combustor, a plurality of compressor stages, and a turbine,
- determining, based on the operational state of the aircraft, a desired electric power to provide to a plurality of thermoelectric sections of a thermoelectric intercooler disposed between one or more of the plurality of compressor stages,
- forming a plurality of compressed air passageways by the plurality of thermoelectric sections,
- forming a plurality of coolant passageways each defining a coolant flow path that extends radially in communication with a turnaround passage formed between two adjacent coolant passageways of the plurality of coolant passageways,
- wherein a compressed air flow path through the plurality of compressed air passageways is transverse to the coolant flow path through the plurality of coolant passageways,
- wherein each of the plurality of thermoelectric sections is disposed between one of the plurality of compressed air passageways and one of the plurality of coolant air passageways, and
- applying the desired electric power to the plurality of thermoelectric sections of the thermoelectric intercooler based on the operational state.

17. The method of operating a gas turbine engine of claim 16, wherein applying the desired electric power includes directing current through the plurality of thermoelectric sections in a first direction to encourage heat removal from a compressor of the engine.

18. The method of operating a gas turbine engine of claim 16, wherein applying the desired electric power includes directing current through the plurality of thermoelectric sections in a second direction to encourage heat transfer into a compressor of the engine.

19. The method of operating a gas turbine engine of claim 16, wherein determining the desired electric power includes receiving information regarding operational parameters of the engine and determining the desired electric power based on the received information.

* * * * *